United States Patent [19]
Spear

[11] 3,952,244
[45] Apr. 20, 1976

[54] TESTER FOR THREE WIRE GROUNDING ELECTRICAL OUTLET

[75] Inventor: Richard R. Spear, Greenbrae, Calif.

[73] Assignee: Communications Technology Corporation, Los Angeles, Calif.

[22] Filed: Oct. 3, 1974

[21] Appl. No.: 511,590

[52] U.S. Cl. .................................. 324/51; 340/255
[51] Int. Cl.² ........................................ G01R 31/02
[58] Field of Search .................. 324/51; 317/18 B; 340/255

[56] References Cited
UNITED STATES PATENTS

| | | | |
|---|---|---|---|
| 3,176,219 | 3/1965 | Behr | 324/51 |
| 3,648,163 | 3/1972 | Pinner et al. | 324/51 |
| 3,753,088 | 8/1973 | Ettelman | 324/51 |
| 3,809,961 | 5/1974 | Kershaw | 317/18 B |
| 3,810,003 | 5/1974 | Portoulas | 324/51 |

Primary Examiner—James B. Mullins
Attorney, Agent, or Firm—Harris, Kern, Wallen & Tinsley

[57] ABSTRACT

A polarity identifier and fault tester for testing three wire grounding type receptacles quickly and in a foolproof manner. A plurality of condition indicators are provided which are activated in a multiplicity of different patterns each representing a different specific condition. Each condition indicator is a go no-go type thereby eliminating the need for interpretation by the operator other than to compare any abnormal pattern with a chart to identify the particular fault condition in the outlet connections. The tester has but a single control comprising a push button switch that requires no connection to ground or other object other than the insertion of the three prong tester plug into the outlet to be checked. A total of 27 possible conditions can be checked and identified as proper or improper by observing the indicator pattern before and upon closing the single control button.

22 Claims, 3 Drawing Figures

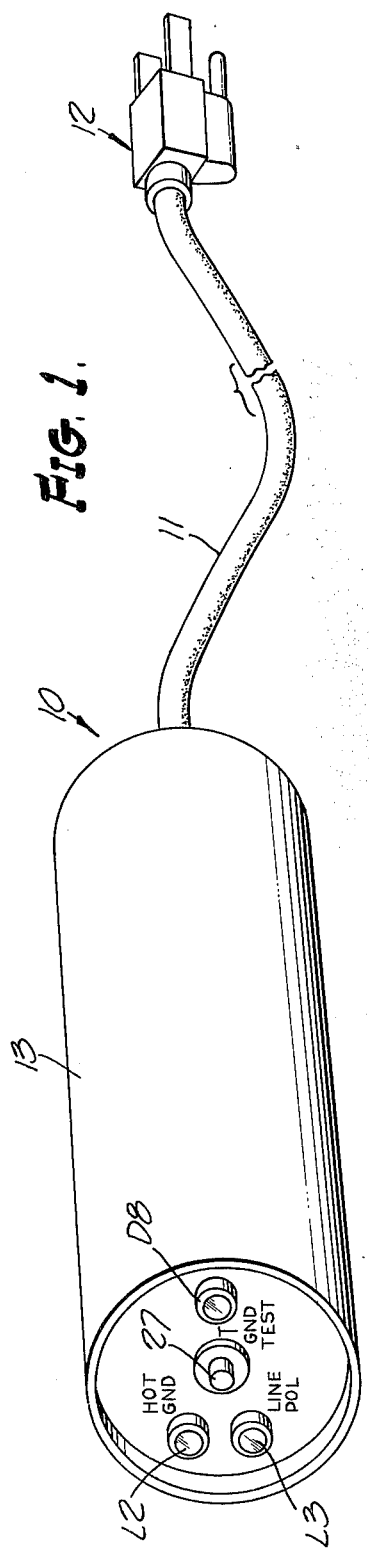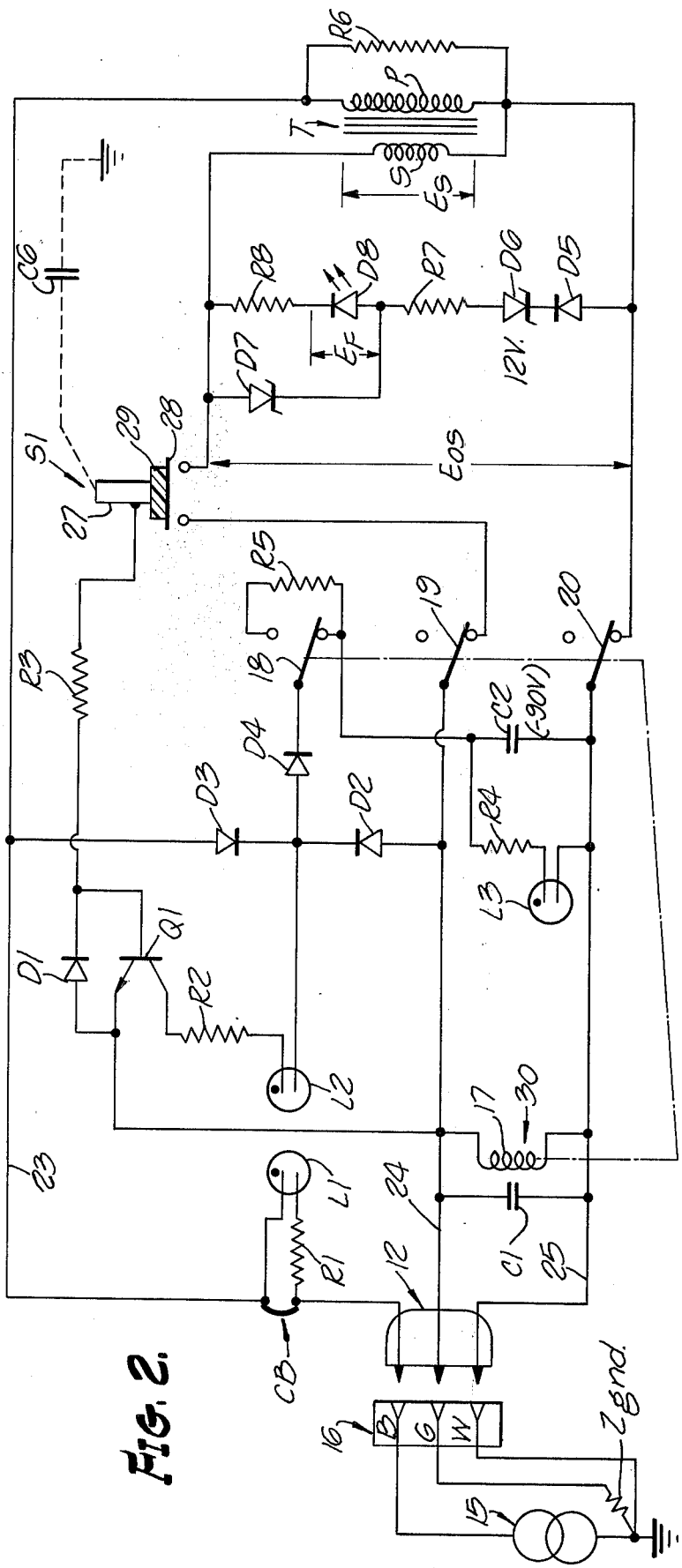

| | RECEPTACLE LEAD EXCITATION STATUS | | | INDICATOR LAMP IDENTIFICATION | | | COMMENTS |
|---|---|---|---|---|---|---|---|
| * | BLACK (HOT) | GRN (GND) | WHITE (NEUT) | WHITE L3 | AMBER L2 | RED D8 | |
| 1 a/b | ○ / ○ | ○ / ○ | ○ / ○ | ○ / ○ | ○ / ○ | ○ / ○ | ALL INDICATORS OFF |
| 2 a/b | ○ / ○ | ○ / ○ | ∼ / ∼ | ○ / ○ | ○ / ○ | ○ / ○ | ALL INDICATORS OFF |
| 3 a/b | ○ / ○ | ∼ / ∼ | ○ / ○ | ○ / ○ | ○ / ○ | ○ / ○ | ALL INDICATORS OFF |
| 4 a/b | ∼ / ∼ | ○ / ○ | ○ / ○ | ○ / ○ | ○ / ○ | ○ / ○ | ALL INDICATORS OFF |
| 5 a/b | ∼ / ∼ | ∼ / ∼ | ○ / ○ | ○ / ○ | ○ / ○ | ○ / ○ | ALL INDICATORS OFF |
| 6 a/b | ∼ / ∼ | ∼ / ∼ | ∼ / ∼ | ○ / ○ | ○ / ○ | ○ / ○ | ALL INDICATORS OFF |
| 7 a/b | ○ / ○ | ∼ / ∼ | ∼ / ∼ | ○ / ○ | ○ / ○ | ○ / ○ | ALL INDICATORS OFF |
| 8 a/b | ∼ / ∼ | ○ / ○ | ∼ / ∼ | ○ / ○ | ○ / ○ | ○ / ○ | ALL INDICATORS OFF |
| 9 a/b | ⊖ / ⊖ | ⊖ / ⊖ | ∼ / ∼ | ◐ / ◐ | ○ / ○ | ○ / ○ | FLASHING POWER INDICATOR |
| 10 a/b | ⊖ / ⊖ | ∼ / ∼ | ⊖ / ⊖ | ◐ / ◐ | ○ / ● | ○ / ○ | FLASHING POWER INDICATION, HOT GROUND INDICATION |
| 11 a/b | ∼ / ∼ | ⊖ / ⊖ | ⊖ / ⊖ | ● / ● | ○ / ○ | ● / ○ | CORRECT PHASE INDICATION |
| 12 a/b | ⊖ / ⊖ | ∼ / ∼ | ∼ / ∼ | ● / ● | ○ / ● | ● / ● | HOT GROUND INDICATION |
| 13 a/b | ⊖ / ⊖ | ⊖ / ⊖ | ○ / ○ | ○ / ○ | ○ / ○ | ○ / ○ | ALL INDICATORS OFF |
| 14 a/b | ∼ / ∼ | ∼ / ∼ | ⊖ / ⊖ | ◐ / ◐ | ○ / ○ | ○ / ○ | FLASHING POWER INDICATOR |
| 15 a/b | ∼ / ∼ | ⊖ / ⊖ | ∼ / ∼ | ◐ / ◐ | ○ / ○ | ○ / ○ | FLASHING POWER INDICATOR |
| 16 a/b | ⊖ / ⊖ | ○ / ○ | ∼ / ∼ | ● / ● | ○ / ● | ● / ● | HOT GROUND INDICATION |
| 17 a/b | ○ / ○ | ○ / ○ | ⊖ / ⊖ | ○ / ○ | ○ / ○ | ○ / ○ | ALL INDICATORS OFF |
| 18 a/b | ○ / ○ | ⊖ / ⊖ | ○ / ○ | ○ / ○ | ○ / ○ | ○ / ○ | ALL INDICATORS OFF |
| 19 a/b | ⊖ / ⊖ | ○ / ○ | ○ / ○ | ○ / ○ | ○ / ○ | ○ / ○ | ALL INDICATORS OFF |
| 20 a/b | ⊖ / ⊖ | ⊖ / ⊖ | ⊖ / ⊖ | ○ / ○ | ○ / ○ | ○ / ○ | ALL INDICATORS OFF |
| 21 a/b | ○ / ○ | ⊖ / ⊖ | ⊖ / ⊖ | ○ / ○ | ○ / ○ | ○ / ○ | ALL INDICATORS OFF |
| 22 a/b | ⊖ / ⊖ | ○ / ○ | ⊖ / ⊖ | ○ / ○ | ○ / ○ | ○ / ○ | ALL INDICATORS OFF |
| 23 a/b | ○ / ○ | ∼ / ∼ | ⊖ / ⊖ | ◐ / ◐ | ○ / ○ | ○ / ○ | FLASHING POWER INDICATOR |
| 24 a/b | ○ / ○ | ⊖ / ⊖ | ∼ / ∼ | ◐ / ◐ | ○ / ○ | ○ / ○ | FLASHING POWER INDICATOR |
| 25 a/b | ⊖ / ⊖ | ∼ / ∼ | ○ / ○ | ○ / ● | ○ / ● | ○ / ● | a BUZZ ALARM. b BUZZ ALARM STOPS |
| 26 a/b | ∼ / ∼ | ⊖ / ⊖ | ○ / ○ | ○ / ● | ○ / ○ | ○ / ● | a BUZZ ALARM b BUZZ ALARM STOPS |
| 27 a/b | ∼ / ∼ | ○ / ○ | ⊖ / ⊖ | ● / ● | ○ / ○ | ● / ● | RED DOES NOT EXTINGUISH WITH SWITCH ENERGIZED |

LEGEND:
⊖ – LEAD AT GROUND (EARTH) POTENTIAL
∼ – LEAD AT ALTERNATING POTENTIAL WITH RESPECT TO THE EARTH
ALL LEADS SO IDENTIFIED ARE IN PHASE WITH ONE ANOTHER.
○ – LEAD OPEN
◐ – FLASHING WHITE

*Switch Condition (a) OPEN (b) CLOSED

FIG. 3.

TESTER FOR THREE WIRE GROUNDING ELECTRICAL OUTLET

This invention relates to electrical test instruments, and more particularly to a handheld tester having prongs insertable into a three wire outlet and usable to check the receptacle for a multiplicity of possible fault conditions.

It is of crucial importance that power outlets be properly wired and that the grounding conductor resistance not exceed a specified maximum value when measured back to the source. It is of course well known that any electrical device having exposed conductive parts exposes the user to possible shock hazards. Thus, if the conductive part of the device is connected to an energized part either as a result of insulation deterioration or mistake in wiring or by any other circumstances, and if there is a conductive path from the user to ground, current can pass from the exposed conductive part through the user's body.

The customary practice to protect the user against such hazards is to ground the conductive parts of the device against the possibility of a potential difference across the user's body from the device to ground. To this end electrical devices are customarily provided with a third conductor for grounding purposes. This equipment grounding conductor is intended to be connected to the grounded protective metal housing of the wiring system. The vital safety factor afforded by the outlet ground terminal is compromised if the connection between that ground terminal and ground is open or inadequate. The safety factor is drastically reduced if the ground connection is loose, dirty, corroded or has insufficient current carrying capacity for any reason. It is also important to know that the other two outlet terminals are properly connected to the correct conductors in a secure manner and in a proper relationship.

Prior proposals have been made for testers capable of testing for one or more of the foregoing conditions but these prior proposals are subject to numerous shortcomings and disadvantages sought to be eliminated by the present invention. In brief, a principal shortcoming of prior testers is the inability to check for more than one or, at best, a limited range of possible faulty conditions. One prior proposal utilizes a tester having three lamps permanently connected in circuit with the respective plug prongs and activated in different combinations to indicate a limited number of incorrect and improper wiring conditions. Among the serious shortcomings of this tester is its inability to test the current carrying adequacy of the ground connection and, additionally, it relies upon partial activation of one or more of the lamps to indicate a poor connection.

To obviate the shortcomings and numerous disadvantages of prior electrical outlet testers, there is provided by this invention a simple, rugged, portable tester having the capability of checking a three wire outlet receptacle for each of 27 different conditions as well as the ability of the ground connection to meet necessary low resistance requirements. The device is encased in an insulated hand-held housing from which a three prong plug of a service cord extends for insertion into a conventional three wire outlet. A single push button control switch mounted on the tester comprises the sole control member. The readout instrumentation is equally simple and typically comprises a plurality of light emitting indicators and an audible indicator, such as a buzzer. Under certain test conditions, one of the indicators is activated in a steady mode and under other conditions in an intermittent mode depending upon the fault detected. Each of these several indicators typically is of the go no-go type thereby eliminating the need for reading or interpreting of values by the user other than to note whether the indicator is activated or not. These several indicators are activated in a particular pattern clearly indicative of proper or improper connections in the outlet receptacle. The operator merely inserts the tester prongs into the outlet, observes the indicators, then depresses the push button and notes whether any change occurs in the indicator pattern. This pattern, upon being checked against a set of all possible patterns, immediately informs the operator whether the outlet is in a proper operating condition and, if not, the nature of the defect. All indications are of the fail safe type for reasons which will become apparent in the following detailed description.

Accordingly, it is a primary object of the invention to provide a unique and improved electrical outlet tester capable of checking the outlet for a multiplicity of errors and indicating whether the outlet meets electrical wiring specifications.

Another object of the invention is the provision of a hand-held portable three wire outlet tester embodying a plurality of go no-go indicators adapted to be energized in a variety of different patterns each indicative of a different condition of the outlet.

Another object of the invention is the provision of a three wire electrical outlet tester for identifying the wiring connections and for checking the adequacy of the ground circuit.

Another object of the invention is the provision of a three wire outlet tester capable of checking the outlet to meet all wiring specifications and utilizing a single control.

Another object of the invention is the provision of an outlet tester which includes means utilizing the body capacity of the operator coupled to "earth ground" as a ground reference when checking an outlet for a hot ground fault.

Another object of the invention is the provision of a three wire tester featuring a single operating control and a plurality of go no-go indicators including audible and visible indicators some of which are selectively activated in either a continuous or an intermittent manner.

These and other more specific objects will appear upon reading the following specification and claims and upon considering in connection therewith the attached drawing to which they relate.

Referring now to the drawings in which preferred embodiments of the invention are illustrated:

FIG. 1 is a perspective view of the tester;

FIG. 2 is a schematic of the circuitry with the parts in their normal de-energized positions; and FIG. 3 is a table listing the 27 possible receptacle conditions and the associated condition of the indicators.

Referring initially to FIG. 1 there is shown an illustrative embodiment of the invention hand-carried tester, designated generally 10 having a three wire service cord 11 provided at its end with a conventional three prong plug 12. Tester 10 is encased in a non-conductive housing 13, having a circuit breaker reset button and a circuit breaker indicator lamp supported in one end thereof. All other indicator lamps and the single control are mounted in the other end of the housing and will be described in detail presently.

Referring now to FIG. 2, there is shown a schematic of the tester circuitry. A conventional AC power source, such as a 120 volt AC source, is indicated at 15. The three wires of this source are connectable to the three terminals of a conventional outlet indicated at 16 in a wide variety of patterns only one of which complies with wiring code requirements.

The tester circuitry for identifying each of these patterns includes three principal leads 23,24,25 connected respectively to the plug prongs marked B, G and W. Prong B normally mates with the hot side of the power source; prong G should mate with the grounding conductor leading back to the power source and prong W with the grounded neutral side. The circuit breaker CB is normally closed and in series with lead 23. This circuit breaker includes a resistor R1 and a normally inactive neon lamp L1. If the circuit breaker opens, lamp L1 is activated to indicate the open condition of the circuit breaker. Preferably, the circuit breaker reset button and lamp L are located at the end of the tester to which service cord 11 is attached and remotely from the other indicators for readily apparent reasons.

Relay coil 17 is connected across main leads 24,25 and includes three normally closed pairs of contacts 18,19,20. The coil of relay 17 and the primary P of the transformer T are in series and across the leads 23,24. Relay coil 17 is normally short circuited, however, when leads 24,25 are connected to ground and neutral leads of AC source 15. The secondary coil S of the transformer delivers approximately 30 volts rms and appears across leads 24 and 25, it being noted that one side of the secondary is in series with the normally open switch S1 and contact 19 of relay 17.

Shunted across the transformer secondary S is a diode D5, a threshold Zener diode D6 which conducts at 12 volts, a current limiting resistor R7, a light emitting diode D8 and a protective resistor R8. The light emitting diode D8 is protected by a Zener diode D7 which limits the voltage across diode D8 to 6 volts. From the foregoing it will be evident that diode D6 provides a threshold which is responsive to an output voltage of 12 volts peak or more from the transformer secondary S to cause the shunt circuit to conduct through the light emitting diode D8 only in the event this shunt circuit is energized by an AC voltage of at least 12 volts peak it being understood that this voltage is merely exemplary and that any selected or suitable threshold voltage can be used if desired without departing from the principles of this invention. It will also be recognized that the value of D7 may also be varied as desired and as necessary to protect diode D8 against excessive voltage.

Lamp L3 functions as a polarity indicator and includes diodes D3,D4, resistor R4 and capacitor C2 connected as shown across leads 23,25. The circuit to lamp L3 is normally closed since the relay contacts 18 are normally closed. Accordingly, if the outlet is properly wired and the tester plug 12 is inserted in outlet 16, indicator L3 remains on in a steady condition thereby indicating that the three power leads are connected to the correct outlet terminals.

The hot ground indicator circuit includes from main lead 23 in series circuit, diode D3, lamp L2, resistor R2, transistor Q1, associated base emitter diode D1, and base resistor R3. This circuit is activated by coupling the base of transistor Q1 to ground by utilizing the effective body impedance shown by C6, coupled to "earth ground" as a reference ground when the operator places his hand on the button of switch S1. It will be understood that the outer end 27 of this button is conductive material and separated from the conductive inner end 28 of the button as by an intervening layer of nonconductive material 29. This insulation avoids risk of the operator's hand being in contact with one of the power lead wires in addition to electrically isolating the transistor base input resistor R3 from the remainder of the circuitry when switch S1 is depressed.

Before proceeding to describe the various different modes of operation of the tester, it is desired to point out certain characteristics or functions of the components. For example, resistors R1, R2, R3, R4, R7 and R8 are current limiting resistors. Resistor R5 is part of an RC network effective to cause lamp L3 to flash intermittently when the R5 is in series with C2. Resistor R6 is a transient suppressing resistor and also functions to lower the impedance of the transformer primary P to provide adequate current to operate relay 17 as a buzzer when the outlet neutral terminal is open.

The hot ground indicator lamp L2 is yellow whereas indicator lamp L3 is white. This latter lamp L3 appears as a steadily activated lamp if the terminal connections are proper and flashes intermittently if the terminal connections are reversed or if the ground connection is hot. The light emitting diode D8 is red when energized. If D8 is illuminated while S1 is held closed, the ground-/neutral connection current carrying capacity is inadequate. Accordingly, it will be understood that D8 extinguishes with S1 held closed to indicate that the current carrying capacity of the outlet ground is adequate.

The function of capacitor C1 is to aid in suppressing the transient voltage when relay 30 is functioning as a buzzer thereby indicating the open condition of the neutral terminal of receptacle 16, whereas capacitor C2 is part of an RC flasher circuit for lamp L3.

Transformer T preferably is a relatively inefficient high leakage inductance type. As herein shown by way of example, when its primary is energized from 115 volt AC line, its secondary has a voltage 25 to 30 volts rms at an output internal impedance of about 4 ohms. Such a transformer is capable of providing about 6 to 7 amperes rms secondary current through a 1 ohm external impedance.

Before proceeding to describe the operation of the tester circuit, attention is invited to FIG. 3 of the drawing representing a logic table summarizing the 27 different possible conditions of the wiring connections to the outlet receptacle 16. The first column lists all possible conditions or ways in which the three power leads can be connected to receptacle 16. These power leads include the white or neutral lead, the green or grounded lead, and the black or hot lead. The letter (a) in the first column indicates that switch S1 is open and the letter (b) indicates that switch S1 is closed. The fifth, sixth and seventh columns indicate the condition of each of the three go, no-go indicators L3, L2 and light emitting diode D8 respectively. A plain, circular symbol represents a de-energized indicator whereas a semi-blocked circular symbol represents a flashing indicator. If the circle is fully blocked it indicates that the indicator is energized steadily.

The last column on the right summarizes the condition represented by the three indicator lamps and the buzzer.

RECEPTACLE CONDITIONS IF ALL TESTER INDICATORS ARE OFF.

If the operator connects the tester service cord plug into outlet receptacle 16 to test its condition and all indicators L2, L3 and D8 remain de-energized, irrespective of whether switch S1 is open or closed, then the operator knows that one of the improper wiring conditions number 1 through 8, 13 and 17 through 22 exists. This is because no power is being supplied to the tester circuit owing to the lack or inadequacy of the power connections to the terminals of outlet receptacle 16. For example, in condition 1 there has been a total failure to connect any of the power leads to the receptacle. In condition 2 only the hot lead of the power source has been connected to the white terminal of the outlet receptacle but neither of the other terminals is connected to any power conductor. Likewise, in condition 3 the white and black terminals of the outlet are open and the hot line has been connected in error to the ground terminal of the outlet. It is deemed unnecessary to comment further respecting the nature of the various other possible modes of connecting the power leads to the outlet terminals all except number 11 of which contain at least one error or defect. Only the connections represented by condition 11 will give an acceptable test result as will be explained presently.

CONDITIONS CAUSING WHITE LIGHT TO FLASH.

Conditions numbers 9, 10, 14, 15, 23 and 24 cause the white light L3 to flash and this flashing continues irrespective of whether switch S1 is open or closed. This distinctive signal is produced despite the fact that the three power leads are connected in a different manner to the outlet receptacle terminals. This is because the same components of the test circuit are energized and cooperate to energize indicator L3 intermittently, and typically four times per second. Thus, in each case, coil 17 of relay 30 is energized and its contacts 18, 19 and 20 shift from their normally closed lower positions to their upper position. When the relay is energized, contact 18 is closed upwardly to place this contact in series circuit with diodes D4, R5 and capacitor C2 whereas contacts 19 and 20 are open.

Thus, considering condition 9A, the table in FIG. 3 shows that tester lead 23 is grounded via the black terminal of the receptacle, lead 24 is connected to ground via the receptacle neutral or ground terminals, and lead 25 is connected to the hot side of the power source via the white terminal. Under these conditions, line potential is applied across the relay coil and its contacts are thereby shifted out of their normally closed position thereby isolating the transformer T from power and those solid state components in circuit with the transformer secondary S. It will also be recognized there is no power source for transistor Q1 and lamp L2. However, lamp L3 is energized intermittently to provide a flashing signal by virtue of power supplied via lead 23 rectifying diodes D2, D3, D4, closed relay contact 18 and R5. This current flow charges C2 to approximately 90 volts at which point indicator lamp L3 is activated by the discharge of C2 via the current limiting resistor R4. As soon as the capacitor discharges the lamp becomes extinguished but is relit as soon as C2 becomes charged to 90 volts or more in the same manner as previously.

The foregoing condition having been observed, the operator may manually close switch S1. However, this effects no change in the tester circuitry or in the operation of indicators L2, L3 or D8 since the transformer circuit continues to remain de-energized.

The operator therefore is advised by the flashing of indicator lamp L3 that power is connected to the receptacle but improperly. Since this same test result is provided for each of the receptacle conditions numbered 9, 14, 15, 23 or 24, the operator knows only that one of these improper conditions exist.

As respects the connection represented by condition 15, it is pointed out that even though tester lead 23 is connected to the hot side of the power source, yet both transistor Q1 and the amber indicator lamp L2 remain inactive even when switch S1 is closed. This is because the transistor emitter is connected to ground via lead 24 and its base is likewise connected to ground when switch S1 is closed because the body of the operator is in contact with the metal switch button with the result that his body represents ground potential by reason of his body capacity C6, that is coupled to "earth ground".

Likewise, in conditions 23 and 24 in the first of which lead 24 is hot and in the second of which lead 25 is hot, there is no source of power for the transistor circuit irrespective of whether switch S1 is open or closed with the result that indicator lamp L2 remains de-energized.

Summarizing the foregoing, it will be evident that under conditions 9, 14, 15, 23 and 24 only indicator L3 is energized and in an intermittent flashing manner. Accordingly, the operator knows that one of the improper wiring conditions represented by this limited number of wire connections must be checked and the errors corrected.

TEST FOR HOT GROUND.

Improper wiring connections represented by condition 10 will be described. Under this condition the hot power conductor is connected to the ground terminal of the receptacle and both of the tester leads 23 and 25 are grounded via the receptacle black and green terminals. The tester functioning to check this condition is closely related to that just discussed above in that relay 30 is energized thereby opening the power supply to the transformer T and to the circuit containing the light emitting diode D8.

While switch S1 remains open, as it does during the normal first half of the test phase, the white indicator L3 flashes intermittently by the alternate discharging of its timer circuit R5, C2, and the charging thereof via rectifiers D2, D4. Rectifier D3 is blocked because its anode is connected to ground via lead 23. Consequently, white lamp L3 flashes intermittently approximately four times per second.

If the operator now holds switch S1 depressed, his body couples the base of transistor Q1 to ground by reason of his body capacity. Thus, when the emitter is driven negative with respect to ground and the transistor collector is at ground potential during negative half cycles of applied line voltage, Q1 will turn on when S1 is touched providing the necessary capacity-coupled ground potential to the base of the transistor.

It is apparent that, as soon as the operator places his hand on the metal switch button 27 of switch S1, and irrespective of whether he closes this switch, the base of Q1 is coupled to ground. Under these conditions the hot ground indicator circuit, which includes Q1 and the amber light L2, is rendered active and effective to energize the amber indicator Ll2 thereby indicating the hot ground condition of the outlet receptacle. The emitter of Q1 is driven negative with respect to ground during the negative half cycles of the power supply, and the collector is held at approximately ground potential by virtue of diode D3. So long as the line potential is operating within the negative portion of its cycle, diodes D2 and D4 are reverse biased and blocked thereby isolating the timer circuitry R5, C2 from the L2 circuitry. In consequence and during this negative half cycle of the power supply to lead 24 transistor Q1 is energized and the power is supplied through its emitter circuit to energize the amber indicator L2 thereby signifying the hot ground condition of outlet receptacle 16. However, since the pulsing collector current flows at a 60 cycle rate, indicator L2 appears to the observer to be illuminated continuously along with the flashing white lamp L3. It will be understood that diode D1 protects the transistor base from being excessively reverse biased under external fault conditions in addition to providing thermal compensation to the base circuit. The current limiting resistor R2 restricts to a safe value the maximum current available to lamp L2.

TESTER OPERATION WITH PROPERLY WIRED OUTLET RECEPTACLE.

If all connections are properly made to the outlet receptacle 16 and the ground therefor has adeuate current carrying capacity as in condition 11 of FIG. 3, the tester operation is as follows:

Upon insertion of the tester service plug 12 into the outlet receptacle 16, tester lead 23 will be connected to the hot black terminal, lead 24 will be connected to the green ground terminal, and lead 25 will be conected to the white neutral terminal. Relay 30 will be deenergized for lack of a potential across its coil with the result that the white indicator lamp L3 is energized in a steady condition by power supplied from hot lead 23 through diodes D3, D4, closed relay contact 18, and current limiting resistor R4. The steady lighted condition of the polarity indicator L3 informs the operator that the connections to outlet 16 are proper.

The functioning of the tester to determine the current carrying capability of the outlet ground facilities will now be described. It will be observed that the transformer primary is energized because it is connected across leads 23, 25. Accordingly, its secondary coil S is energized and so is the ground capacity test circuit connected across this coil. The latter circuit includes the current limiting resistor R7, R8, the two Zener diodes D6, D7, the rectifier diode D5 and the light emitting diode D8. The 30 volts RMS (43 volts peak) output of the secondary coil exceeds the nominal 12 volt threshold voltage of zener diode D6 causing the latter to become conductive thereby energizing the light emitting diode D8. The life of this diode is greatly extended by the presence thereacross of Zener diode D7 having a threshold voltage of 6 volts. This limits the peak voltage across D8 to this value.

Having noted the lighted condition of D8, the operator knows that the transformer test circuit is functioning properly whereupon he proceeds to depress the button of switch S1 thereby connecting the transformer secondary circuit across tester leads 24 and 25 via the closed contacts 19 and 20 of relay 30. The impedance of the grounding path of a properly grounded outlet receptacle should not exceed 2 ohms. If it is below this value the test circuit, which includes indicator D8, will place a heavy current shunt across secondary S causing the voltage drop in the test circuit and across D6 to fall below 12 volts (peak) thereby cutting off D6 and de-energizing D8. However, if the impedance of the ground circuit with S1 closed is greater than 2 ohms, then the current drain is insufficient to render diode D6 nonconductive with the result that D8 remains lighted thereby apprising the operator that the impedance of the grounding path is too high and the current carrying capacity of the ground circuit is inadequate and in need of correction.

Extinction of D8 due to a satisfactory low ground impedance is described in greater detail as follows. Prior to closing S1, Zener diode D6 conducts whenever the instantaneous value of the secondary voltage Eos exceeds 12 volts thereby energizing D8. When switch S1 is closed, D8 becomes extinguished when the following criteria is satisfied, viz:

$$Eos = Ez + Ef$$

where $Eos$ = transformer secondary peak output voltage under loaded conditions $Ez$ = Zener D6 threashold voltage $Ef$ = forward voltage drops of D8 + D5

But $$Eos = Es \times \frac{Zgnd}{Zi + Zgnd}$$

where $Zgnd$ = ground leg impedance (1.5 to 2 ohm permissible)

$Zi$ = transformer source impedance (leakage reactance plus winding resistance)

$Es$ = open circuit peak output voltage of the transformer $T$.

From the foregoing it can be shown that D8 becomes extinguished when:

$$Zgnd = \text{ or less than } \frac{Zi}{\frac{Es}{Ez + Ef} - 1}$$

This establishes the threshold of acceptability of the ground impedance. For the circuit herein described, typical values are:

$Zi$ = 4 ohms; secondary impedance $Es$ = 42.0 v; peak voltage $Ez$ = 12.0 volts; threshold voltage of D6

$Ef$ − 1.0 volts; forward drop across D8 + D5

The maximum (high limit) value of the ground impedance $Zgnd$ that will cause indicator D8 to extinguish when the test switch is depressed would be 1.8 ohms in a typical case. The minimum ground current flowing in the ground circuit to extinguish D8 would therefore be:

$$Ignd \text{ (rms)} = \frac{Es(\text{rms})}{Zi + Zgnd} = 5.1 \text{ amps rms}$$

If the ground circuit impedance is below the maximum permissible value with only the transformer secondary voltage applied to it, the operator knows that the ground connections of outlet 16 are adequate since, if the full voltage of 115 volts were applied across leads 24, 25, a current flow in excess of 50 amps would be provided, a value substantially in excess of that required to open a 20 amp circuit breaker.

TESTING FOR CONDITIONS 12 and 16.

The results obtained when testing for conditions 12 and 16 are substantially the same and will be described next. In condition 12, the hot power leads are connected to both the neutral and the ground terminals of the receptacle and the normally hot receptacle terminal is grounded. In condition 16, the same lead conditions exist but the ground lead is open. Nevertheless, the tester indicators are energized in the same pattern for both condition 12a and 16a (when switch S1 is open). Accordingly, the description of the operation for condition 12a will suffice for both 12a and 16a.

Using condition 12a for illustrative purposes and bearing in mind that the hot power conductor of receptacle 16 is connected to power lead 25 terminal and that the power lead 23 is grounded, it will be recognized that no voltage appears between tester leads 24 and 25. Accordingly, relay 30 is deactivated and contact 20 is closed with the result that the transformer T is energized and D8 is activated to provide a continuous red signal. Likewise, since contact 18 is also closed, power is supplied to the white lamp indicator L3 to provide apparent continuous energization of this indicator. So long as button 21 is not contacted by the operator (C6 not present), indicator L2 remains deactivated because Q1 floats at the emitter potential since no base drive voltage is present. Accordingly, Q1 remains cut off during the negative half cycle even though its emitter is driven to minus peak voltage and the collector is clamped at ground potential by D3.

As the operator contacts and closes the metal button of switch S1, the base of Q1 is grounded by the operator's body capacity C6. In consequence, the hot ground indicator L2 is activated during the negative half cycles of the line voltage. During this period the transistor emitter is driven negative with respect to ground and the collector is clamped to ground potential. It will also be recognized that during this period D2 is reverse biased. It will be understood that typical body capacitance to earth ground is approximately 150 uuf which is sufficient to cause Q1 base current to flow through R3 thereby rendering Q1 conductive. Since the pulsing collector current flows at a 60 cycle rate, the amber hot ground indicator L2 appears to be continuously illuminated.

The same operating results prevail when the tester is used to check wiring condition 16. The only difference is that the current flow through hot ground indicator L2 takes place through the coil of the relay but this current flow is inadequate to energize the relay and open its contacts. Likewise, the current flow through the relay derived from the secondary circuit of the transformer when S1 is closed is equally inadequate to energize the relay.

OPERATION WITH OPEN NEUTRAL CONDITIONS 25 and 26.

In using the tester to check condition 25 of FIG. 3, it will be understood that the hot side of the power source is connected to power lead 24 and the grount terminal of receptacle 16 is connected to lead 23. It will also be understood that the neutral terminal of the receptacle is not connected to lead 25.

So long as switch S1 is open, the contacts 18, 19, 20 of relay 30 will rapidly open and close because the coil of this relay is in series with the transformer primary across tester leads 23 and 24. Under these conditions, the rms voltage across the relay coil will be approximately 65 volts and the rms voltage across the transformer primary will be 70 volts. It will be understood that these values prevail if the impedance of the relay coil circuit is approximately 3.2 kilohms. In these circumstances the relay voltage approaches a reliable pull-in value with the result that the relay buzzes or chatters in a self-interrupting mode of operation. This may cause low intensity flickering of indicators L3 and D8 but such flickering is of no significance since the audible buzzer alarm indication is considered of major importance.

If the operator now closes switch S1, the secondary voltage of transformer T is impressed across the relay and is inadequate to energize the relay and open its contacts. Accordingly, so long as the switch button remains closed, the relay remains quiet and will not buzz.

Since relay contact 18 now remains closed, indicator L3 is energized by power supplied from lead 23 through D3, D4, R4, L3 and lead 25.

Indicator L2 is also now activated during negative half cycles of the line voltage for the same reasons explained above in describing the closed switch description of the tester for conditions 12 and 16. The very distinctive pattern of signals provided in part with the switch open and in part by the switch being closed informs the operator that the hot power lead is connected to the ground terminal of the receptacle and that the normally hot terminal of the receptacle is grounded.

The operation of the tester for condition 26 is closely related to that described above for condition 25. In the test for condition 26 the hot side of the power source is connected to lead 23 and the grounded side of the power source is connected to the ground terminal of the receptacle (lead 24). The receptacle neutral terminal (w) remains open.

Initially and with switch S1 open, it will be evident that the relay coil is connected in series with the transformer primary as in condition 25, with the result that the voltage drop across these two coils is the same as described above and adequate to cause the relay contacts to open and close to provide a strong chattering or buzzing signal. Indicators L3 and D8 may flicker weakly but the resulting visual signal is irrelevant and of no significance compared to the major audible buzzing alarm.

If now, the operator closes S1, the energized transformer secondary is impressed on relay 30 with the same results described above, namely, the applied voltage from secondary S is too low to cause the relay to pull-in, therefor contact 18 remains closed and the buzzing signal ceases. At the same time, the closed condition of relay contact 18 provides a power circuit for indicator L3 which is energized by power supplied via D3, D4, relay contact 18, R4 which passes through indicator L3 to the grounded power lead 25. Indicator L2 remains inactive since Q1 is cut off for lack of positive base drive for Q1. The resulting test pattern will therefore be recognized as different from that obtained in condition 25 and the operator therefore knows that the hot side of the power supply is properly connected but that the ground wire terminal of the receptacle is grounded and that the neutral terminal of the receptacle is open.

TESTER OPERATION FOR CONDITION 27.

In condition 27 of FIG. 3, the hot power lead is properly connected to tester lead 23 and the neutral terminal of the receptacle is properly connected to lead 25 of the tester; however, the receptacle ground terminal is open. It follows that inadequate coil pull-in power is supplied to the relay coil 17 and the relay contacts remain in their normal closed position. Accordingly, power is supplied from lead 23 to activate lamp indicator L3 steadily via D3, D4, contact 18 and resistor R4.

Indicator L2 is extinguished since amplifier Q1 remains cut off due to not receiving any effective source of positive base drive. Q1 therefore, remains in the cut off condition even when the collector is driven positive with respect to ground.

The transformer primary is connected across the power leads 23, 25 thereby energizing the secondary S, and indicator D8, connected in circuit with the transformer secondary, will be activated. If the ground circuit capacity is inadequate D8 will not be extinguished when S1 is depressed or activated for reasons explained in detail above in connection with condition 11.

When the operator closes switch S1 no change occurs since the receptacle ground terminal is open. Accordingly, indicator D8 remains illuminated.

Typical values and specifications for the tester components are as follows:

R2 - 22K
R3 - 1 megohm
R4 - 22K
R5 - 470K
R6 - 5K 5 watts
R7 - 680 ohms ½ watt
C1 - 0.1 uf - 400 V
C2 - 0.1 uf - 200 V
Q1 - 2N-3858A
D1 - 1N914
D2 - 1N4004
D3 - 1N4004
D4 - 1N4004
D5 - 1N4004
D6 - 1N5242
D7 - 1N5233
D8 - B2190-6V (Industrial Devices)
T - Internal impedance transformer reflected to the secondary - about 4 ohms While the particular tester for three wire grounding electrical outlet herein shown and disclosed in detail is fully capable of attaining the objects and providing the advantages hereinbefore stated, it is to be understood that it is merely illustrative of the presently preferred embodiment of the invention and that no limitations are intended to the detail of construction or design herein shown other than as defined in the appended claims.

I claim:

1. In a polarity identifier and fault tester for testing a three wire ac outlet having a line voltage terminal, a neutral terminal, and a ground terminal, the combination of:
   a three wire plug including a line prong, a neutral prong, and a ground prong mateable with corresponding terminals of said outlet;
   a first switching circuit having an input connected across said neutral and ground prongs and switchable between a first condition when there is no voltage across said neutral and ground prongs and a second condition when there is line voltage across said neutral and ground prongs;
   a testing circuit having an input connected between said line prong and the output of said first switching circuit, and an output with a first indicator circuit connected thereat;
   a second switching circuit for connecting the output of said testing circuit across said neutral and ground prongs through said first switching circuit when said first switching circuit is in said first condition; and
   a second indicator circuit connected between the output of said first switching circuit and one of said neutral and ground prongs and including a second indicator and an oscillator circuit, with said oscillator circuit switched in circuit with said second indicator when said first switching circuit is in one of said first and second conditions.

2. A tester as defined in claim 1 wherein said first switching circuit connects said testing circuit across said line and neutral prongs when in said first condition, and said first indicator circuit includes a first indicator energized by said testing circuit when there is line voltage across said line and neutral prongs.

3. A tester as defined in claim 2 wherein said second switching circuit when actuated connects said first indicator circuit in shunt relation with said neutral and ground prongs with said first indicator being unenergized when the impedance of the path between said neutral and ground prongs is less than a predetermined value.

4. A tester as defined in claim 3 wherein said first indicator circuit includes a voltage regulator for setting said predetermined value.

5. A tester as defined in claim 4 wherein said testing circuit includes a transformer, said first indicator is a light emitting diode, and said voltage regulator includes a zener diode, with said first indicator circuit connected across the secondary winding of said transformer.

6. A tester as defined in claim 3 wherein said second switching circuit includes a manually operable normally open switch.

7. A tester as defined in claim 1 wherein said first switching circuit connects the inputs of said testing circuit across said line and neutral prongs when in said first condition, and said second switching circuit when actuated connects the output of said testing circuit across said neutral and ground prongs providing a current supply to the ground and neutral terminals of the outlet.

8. A tester as defined in claim 1 wherein said first switching circuit includes a circuit for connecting said second indicator circuit to said line prong and switching said oscillator circuit in and out of circuit with said second indicator as said first switching circuit changes conditions providing flashing and steady indications.

9. A tester as defined in claim 1 wherein said first switching circuit includes a relay with a contact set for connecting said second indicator circuit to said line prong and switching said oscillator circuit in and out of circuit with said second indicator.

10. A tester as defined in claim 9 werein said oscillator circuit includes a resistance-capacitance unit with said contact set connecting said second indicator to said line prong bypassing said resistance for one of said conditions.

11. A tester as defined in claim 1 wherein said first switching circuit comprises a relay with a plurality of contact sets, with the relay coil connected across said ground and neutral prongs.

12. A tester as defined in claim 10 wherein a first contact set of said relay connects said testing circuit to one of said neutral and ground prongs and a second contact set connects said second switching circuit to the other of said neutral and ground prongs when in said first condition.

13. A tester as defined in claim 12 wherein a third contact set of said relay connects said second indicator circuit to said line prong when in said first and second conditions, bypassing said oscillator circuit when in one of said conditions.

14. A tester as defined in claim 1 including a third indicator circuit having a third switching circuit connected between said line prong and one of said neutral and ground prongs and a third indicator energized by said third switching circuit, said third switching circuit including an element for manual engagement providing a circuit to ground through the operator.

15. A tester as defined in claim 14 wherein said third switching circuit element comprises the actuating portion of said second switching circuit.

16. A tester as defined in claim 14 wherein said third switching circuit includes a transistor with said third indicator in the emitter-collector circuit thereof and with the transistor base connected to said element.

17. A tester as defined in claim 14 wherein said second switching circuit includes a push button which comprises said element of said third switching circuit whereby said second and third switching circuits may be actuated simultaneously by a single action of the operator.

18. A tester as defined in claim 1 wherein the inputs of said testing circuit and first switching circuit are connected in series across said hot and ground prongs, with said testing circuit dropping the voltage to said first switching circuit such that said first switching circuit switches intermittently when line voltage is at said hot and ground prongs.

19. A tester as defined in claim 18 with said second switching circuit when actuated connecting the output of said testing circuit to the input of said first switching circuit blocking said intermittent operation.

20. A tester as defined in claim 18 wherein said testing circuit includes a transformer and said first switching circuit includes a relay, with the transformer primary and the relay coil connected in series.

21. A tester as defined in claim 20 with said second switching circuit when actuated connecting the transformer secondary to the relay coil blocking said intermittent operation.

22. In a polarity identifier and fault tester for testing a three wire ac outlet having a line voltage terminal, a neutral terminal, and a ground terminal, the combination of:
a three wire plug including a line prong, a neutral prong, and a ground prong mateable with corresponding terminals of said outlet;
a first switching circuit having an input connected across said neutral and ground prongs and switchable between a first condition when there is no voltage across said neutral and ground prongs and a second condition when there is line voltage across said neutral and ground prongs;
a testing circuit having an input connected between said line prong and the output of said first switching circuit, and having an output with a first indicator circuit connected thereat;
a second switching circuit for connecting the output of said testing circuit across said neutral and ground prongs through said first switching circuit when said first switching circuit is in said first condition; and
a second indicator circuit connected between the output of said first switching circuit and one of said neutral and ground prongs and including a second indicator connected by said first switching circuit to said line prong when aid first switching circuit is in one of said first and second conditions.

* * * * *

UNITED STATES PATENT AND TRADEMARK OFFICE
CERTIFICATE OF CORRECTION

PATENT NO. : 3,952,244
DATED : April 20, 1976
INVENTOR(S) : RICHARD R. SPEAR

It is certified that error appears in the above-identified patent and that said Letters Patent are hereby corrected as shown below:

Column 6, line 39, after "will" insert --now--;

Column 7, line 2, "indicator L12" should be --indicator L2--;

Column 7, line 29, "adeuate" should be --adequate--;

Column 8, line 24, "threashold" should be --threshold--;

Column 9, line 63, "grount" should be --ground--;

Column 12, line 46 (claim 7), "inputs" should be --input--;

Column 12, line 64 (claim 10), "werein" should be --wherein--;

Column 13, line 5 (claim 12), "claim 10" should be --claim 11--;

Column 14, line 40 (claim 22), "aid" should be --said--.

Signed and Sealed this

Fourteenth Day of September 1976

[SEAL]

Attest:

RUTH C. MASON
*Attesting Officer*

C. MARSHALL DANN
*Commissioner of Patents and Trademarks*